United States Patent [19]
Kuwano et al.

[11] 4,127,432
[45] Nov. 28, 1978

[54] METHOD FOR MOUNTING CHIP TYPE CIRCUIT ELEMENTS ON A PRINTED CIRCUIT BOARD AND APPARATUS FOR PERFORMING THE SAME

[75] Inventors: Satoshi Kuwano, Kawanishi; Shun-ichi Yabuzaki, Neyagawa; Satoshi Kitaichi, Ibaragi; Seiichi Takesawa, Kadoma; Hitoshi Minabe, Neyagawa; Tsuneshi Nakamura, Katano, all of Japan

[73] Assignee: Matsushita Electric Industrial Co., Ltd., Kadoma, Japan

[21] Appl. No.: 786,944

[22] Filed: Apr. 12, 1977

[30] Foreign Application Priority Data

Apr. 12, 1976 [JP] Japan .................................. 51-41572

[51] Int. Cl.² ...................... H01L 21/98; B32B 31/26; C09J 5/06
[52] U.S. Cl. .................. 156/297; 29/569 R; 29/740; 29/757; 156/562; 156/565; 214/8.5 R; 214/8.5 A; 221/93
[58] Field of Search ............................. 156/560–562, 156/564, 565, 299, 297, 323, 499, 573; 29/740, 741, 569 R, 577 R, 577 C, 757, 809; 221/209, 93, 310; 214/8.5 R, 8.5 A, 8.5 C

[56] References Cited
U.S. PATENT DOCUMENTS

| 1,746,988 | 2/1930 | Brautigam | 156/565 X |
| 1,946,878 | 2/1934 | Pazziani et al. | 156/299 |
| 3,600,246 | 8/1971 | Breen | 156/299 X |
| 3,658,618 | 4/1972 | Gramann | 156/299 X |
| 3,710,479 | 1/1973 | Bernardo et al. | 29/741 |
| 3,890,185 | 6/1975 | Umazume | 214/8.5 A X |

Primary Examiner—William A. Powell
Assistant Examiner—Thomas Bokan

[57] ABSTRACT

Chip type circuit elements are mounted on adhesive layers provided on predetermined positions of a printed circuit board by pushing up each circuit element stack inserted in a magazine which is vertically held just below the corresponding adhesive layer and which is inserted through a corresponding through-hole defined by a lattice-shaped and horizontally placed magazine guide. This method and apparatus can quickly mount chip type circuit elements on the printed circuit board, and make possible an easy change of the circuit element pattern, without necessitating the use of an NC machine.

34 Claims, 18 Drawing Figures

METHOD FOR MOUNTING CHIP TYPE CIRCUIT ELEMENTS ON A PRINTED CIRCUIT BOARD AND APPARATUS FOR PERFORMING THE SAME

This invention relates to a method for mounting chip type circuit elements on a printed circuit board and apparatus for performing the same.

A chip type circuit element e.g. for a resistor or a capacitor is well known. It is a bare bulk material provided with electrodes and with electrical lead, and is often used in a hybrid integrated circuit. When chip type circuit elements are required to be mounted on a printed circuit board, conventionally the chip type circuit elements are mounted one by one on the base plate of the printed circuit board using a numeric control apparatus (so called NC apparatus) which controls the relative position between the base plate and each chip type circuit element.

However, using such an NC apparatus, the mounting of circuit elements cannot be performed at a high speed because the mounting speed is limited by the speed of the pulse motor used therein. Further, since the NC apparatus is very expensive the complete mounting apparatus is also very expensive.

It is an object of this invention to provide a method and an apparatus for mounting chip type circuit elements on a printed circuit board by which the mounting can be performed easily and very quickly without necessitating the use of an NC apparatus.

This object is achieved according to this invention by providing a method comprising: horizontally positioning a printed circuit board having a plurality of adhesive layers at predetermined positions on the bottom major surface thereof; arranging a plurality of tubular magazines in correspondence with said adhesive layers in a manner such that each tubular magazine is held vertically below said printed circuit board by being inserted in a corresponding through-hole defined by a horizontally placed lattice-shaped magazine guide, and that the top opening of each tubular magazine faces the corresponding adhesive layer, each tubular magazine having a plurality of chip type circuit elements stacked in the tube thereof; and simultaneously pushing up each circuit element stack in each tubular magazine for pressing the top circuit element in each circuit element stack onto the corresponding adhesive layer so as to bond said top circuit element to the corresponding adhesive layer. The apparatus for performing this method according to this invention comprises: a support for horizontally supporting, at a predetermined level and at a predetermined position, a printed circuit board having a predetermined number of adhesive layers at predetermined positions on the bottom major surface thereof a; lattice-shaped magazine guide which is horizontally positioned below said printed circuit board and which has a plurality of equally spaced through-holes, the through-holes corresponding to said adhesive layers and being positioned on the same vertical lines as said adhesive layers; a plurality of tubular magazines arranged in correspondence with said adhesive layers and vertically held and inserted through corresponding through-holes of said magazine guide, in a manner such that the top opening of each tubular magazine faces the corresponding adhesive layer, each of said tubular magazines having a plurality of chip type circuit elements stacked in the hollow tube thereof; a circuit element transfer means for pushing up each circuit element stack in each tubular magazine for pressing the top circuit element in each circuit element stack onto the corresponding adhesive layer so as to bond said top element to the corresponding adhesive layer; and a push-up plate which supports said tubular magazines and which pushes each tubular magazine up along the inner walls of the corresponding through-hole to move the top opening of each tubular magazine to a position close to and facing the corresponding adhesive layer before the pressing and bonding operation by said circuit element transfer means.

This invention will be described in detail hereinafter with the aid of the accompanying drawings, in which.

Figure 10A:
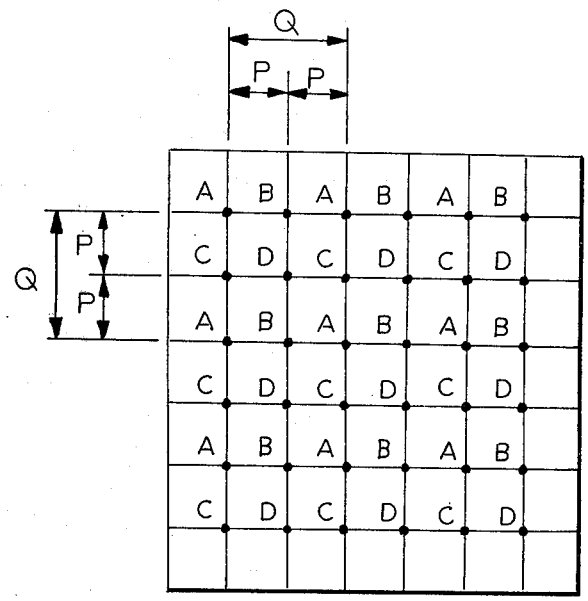
Figure 10B:
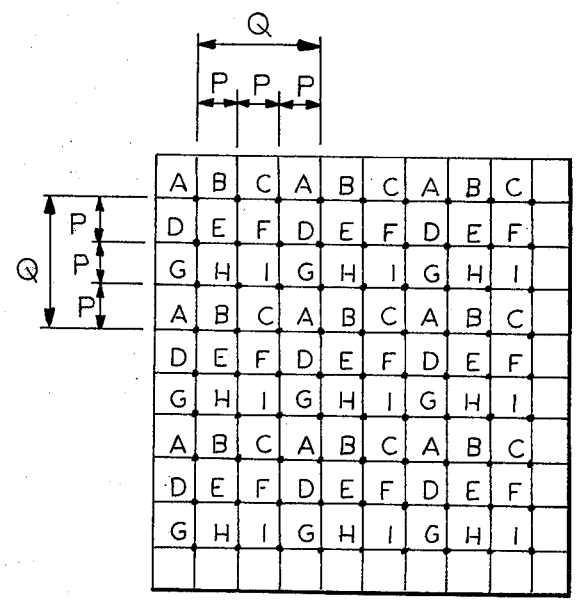
Figure 11:
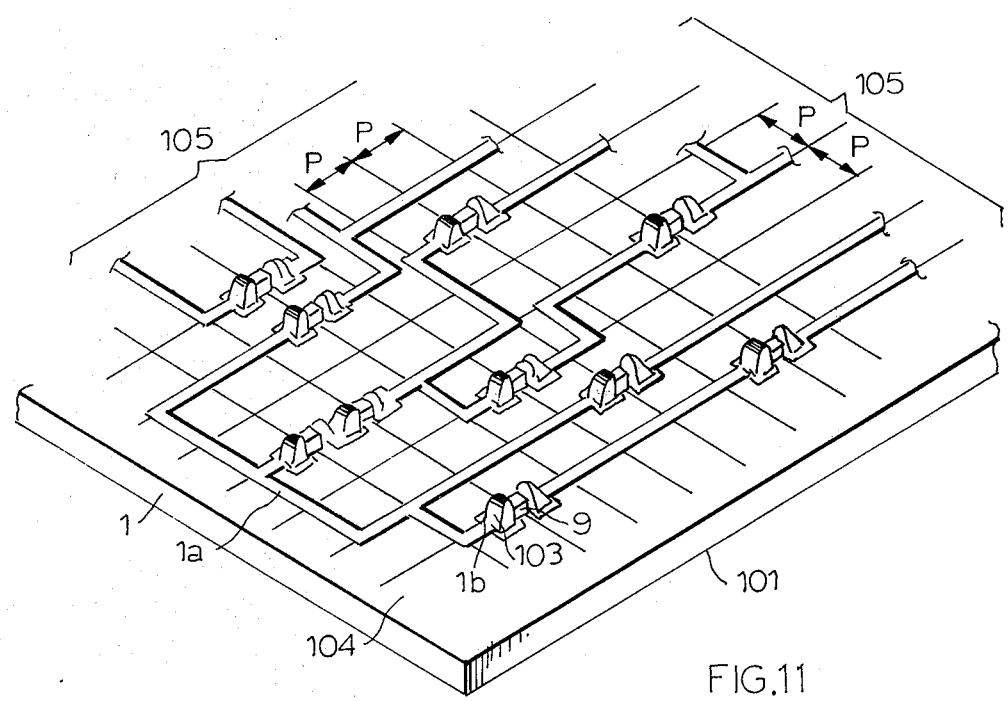
Figure 12:
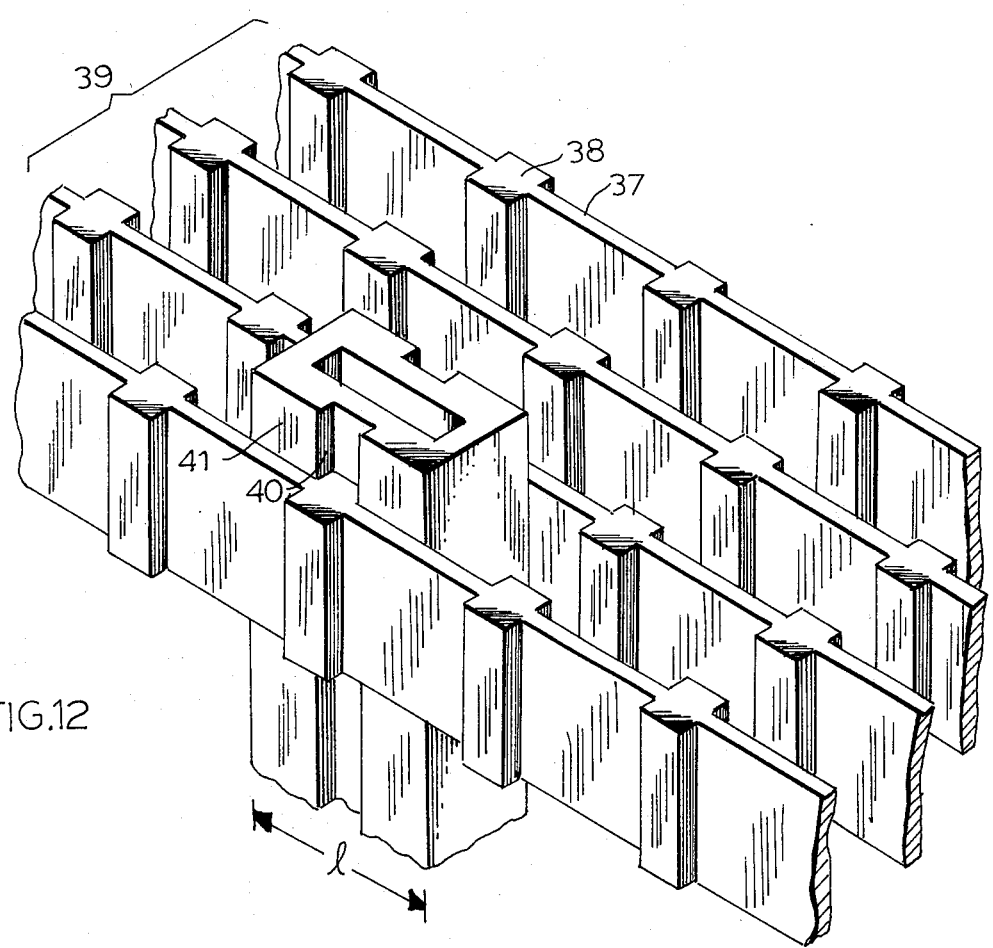
Figure 13:
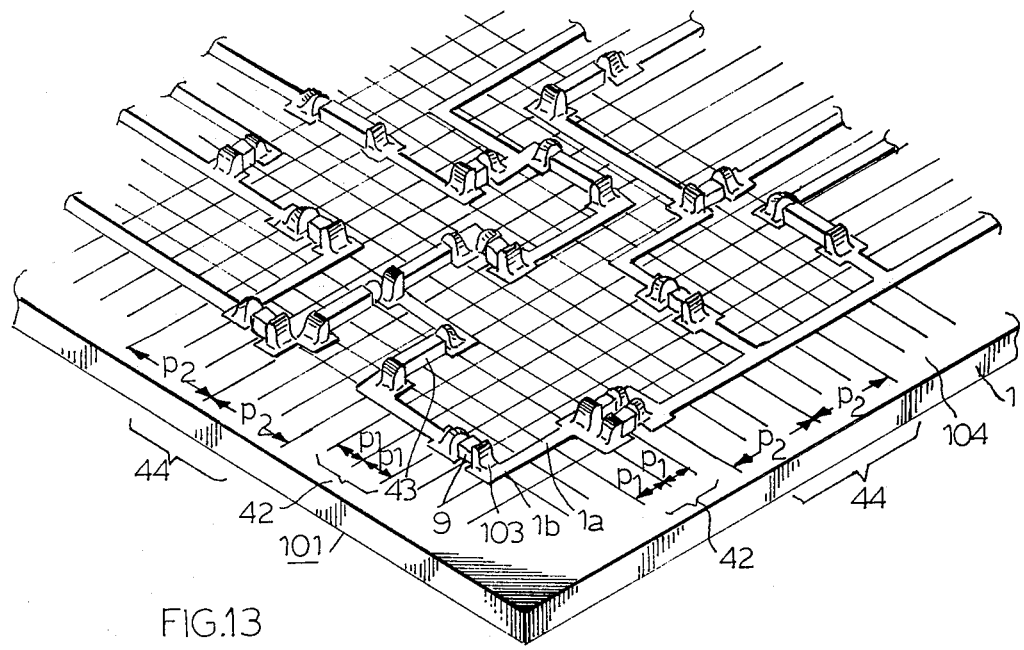
Figure 14:
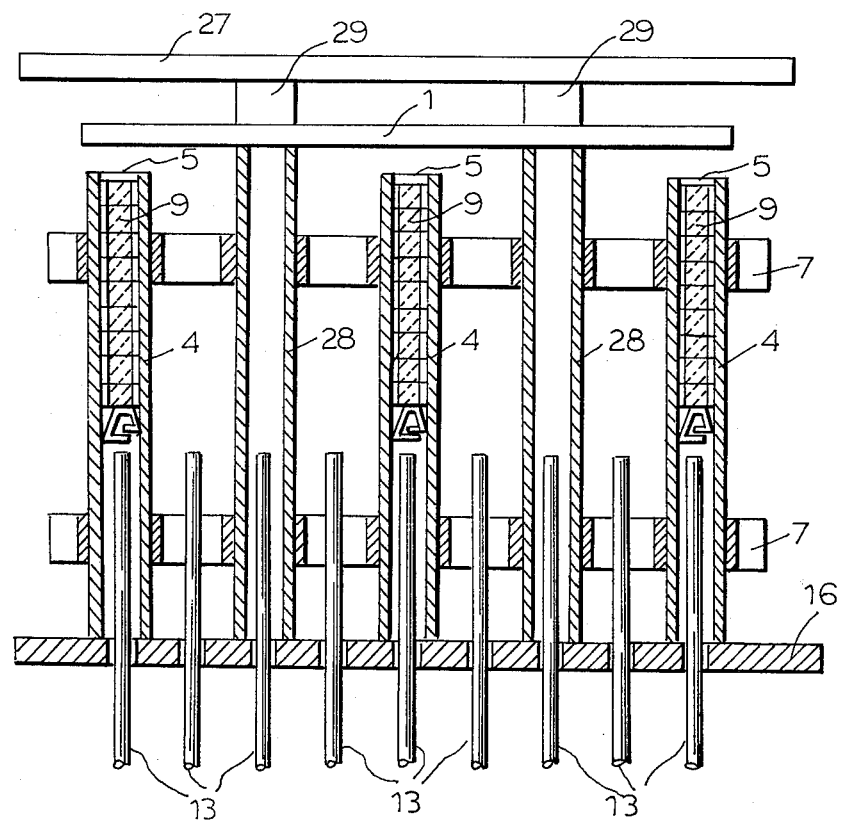

Each of FIGS. 9(A), 9(B), 9(C) and 9(D) is an enlarged schematic top plan view of another example of a magazine supported by a lattice-shaped magazine guide;

Each of FIGS. 10(A) and 10(B) is a chart for identifying the positions at the base plate of a printed circuit board on which the chip type circuit elements are to be positioned;

FIG. 11 is a schematic perspective view of a main portion of another example of a printed circuit board with chip type circuit elements, made according to this invention;

FIG. 12 is a schematic perspective view of a portion of another example of magazine supported by another magazine guide;

FIG. 13 is a schematic perspective view of the main portion of yet another example of a printed circuit board with chip type circuit elements, made according to this invention; and FIG. 14 is a schematic front cross-sectional view of a base plate supporter shown together with a portion of a circuit element mounting apparatus.

Figure 1:
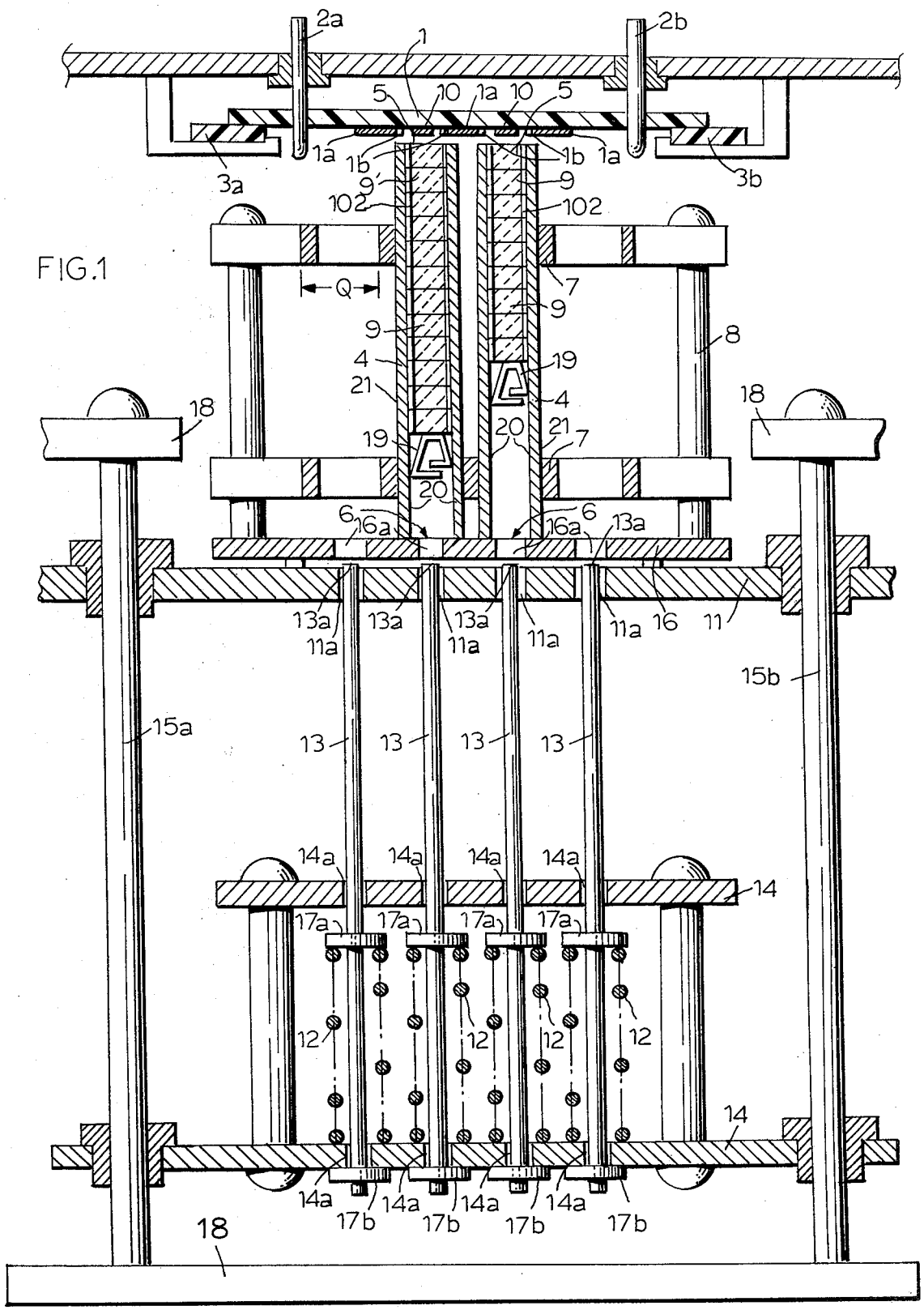
FIG. 1 is a schematic front cross-sectional view of an example of a circuit element mounting apparatus according to this invention for mounting chip type circuit elements on a printed circuit board.

Referring to FIG. 1, the base plate 1 for a printed circuit board having a predetermined pattern of copper foil 1a, as laminar conductors, is transferred by transfer belts 3a and 3b to a predetermined position where circuit element mounting is carried out and this position is determined by position-determining pins 2a and 2b which can be moved vertically. After the belts 3a and 3b have transferred the base plate 1 to the predetermined position and the pins 2a and 2b have been moved vertically downward to fix the position of the base plate 1, the movement of the belts 3a, 3b and the pins 2a, 2b is stopped. The four elements 2a, 2b, 3a and 3b constitute a base plate supporter for supporting the base plate 1.

Figure 6:
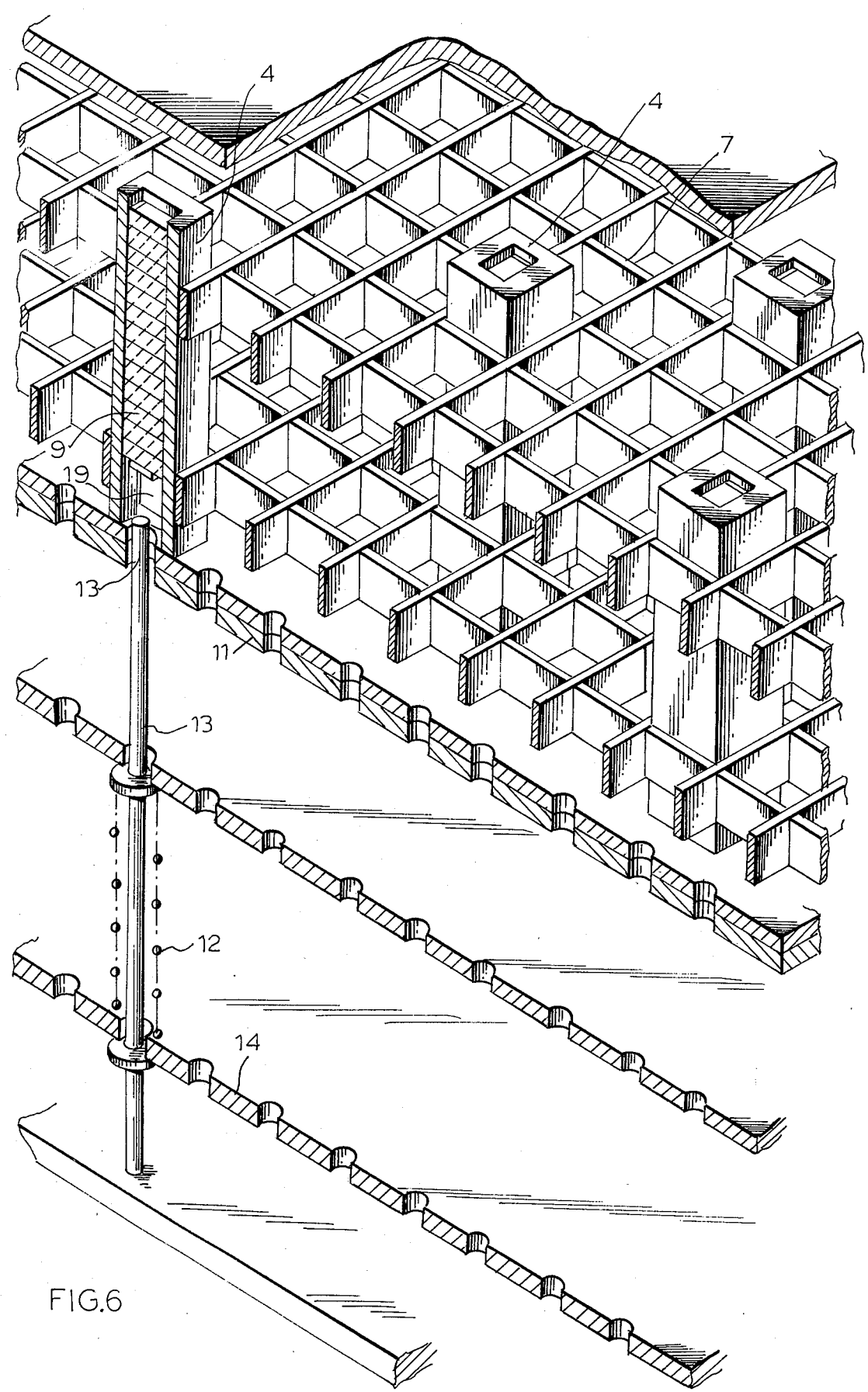
FIG. 6 is an enlarged schematic perspective view, partially cut away, of a main portion of the apparatus of FIG. 1.

As seen in FIGS. 1 and 6, inside a tubular magazine 4 which has a cross-section e.g. in the shape of a rectangle and which functions as a chip type circuit element supply means, a plurality of chip type circuit elements 9 each having a cross-section similar to that of the tubular magazine 4 and preferably having a parallelepiped shape are slidably stacked in a manner such that the major face of each circuit element 9 is positioned on the top. Thus, the ends of each circuit element 9 carrying electrodes 102 slide along the inner wall surfaces of the magazine 4, as shown. The stack of circuit elements is supported by a circuit element supporter 19 which contacts the lowermost circuit element and which is forced against the inner wall surface with sufficient pressure to cause sufficient frictional force with the inner wall surface to support the circuit element stack. The tubular magazine 4 is supported by a magazine supporter 8 which comprises a pair of lattice-shaped magazine guides 7. Each magazine guide 7 is preferably composed of a rectangular lattice made of a first set of equally spaced parallel plates and a second set of equally spaced parallel plates which are perpendicular to said first set of parallel plates, whereby a plurality of parallelepiped through-holes at the same pitch Q are formed (i.e. the width of each through-hole being Q less the thickness of a plate). The cross-section of each through-hole is about the same as that of the magazine 4. One tubular magazine 4 is inserted into one of the through-holes in one of the two magazine guides 7 and also into the corresponding through-hole in the other magazine guide 7, as shown, and is thus held vertically. Thus, the top opening 5 of the magazine 4 faces the base plate 1 as shown. Each outer wall 21 of the tubular magazine 4 has a flat surface so that the magazine 4 can smoothly slide along the inner walls of the through-holes and can be guided by the through-holes of the magazine guides 7. Thus, the relative position between the top opening 5 of the magazine 4 and the base plate 1 can be easily controlled.

At the position of the base plate 1 facing the top opening 5 of the magazine 4, an adhesive material layer 10, preferably of a thermosetting material, is provided for holding a chip type circuit element at the position at least before and during a subsequent soldering step.

Figure 2:
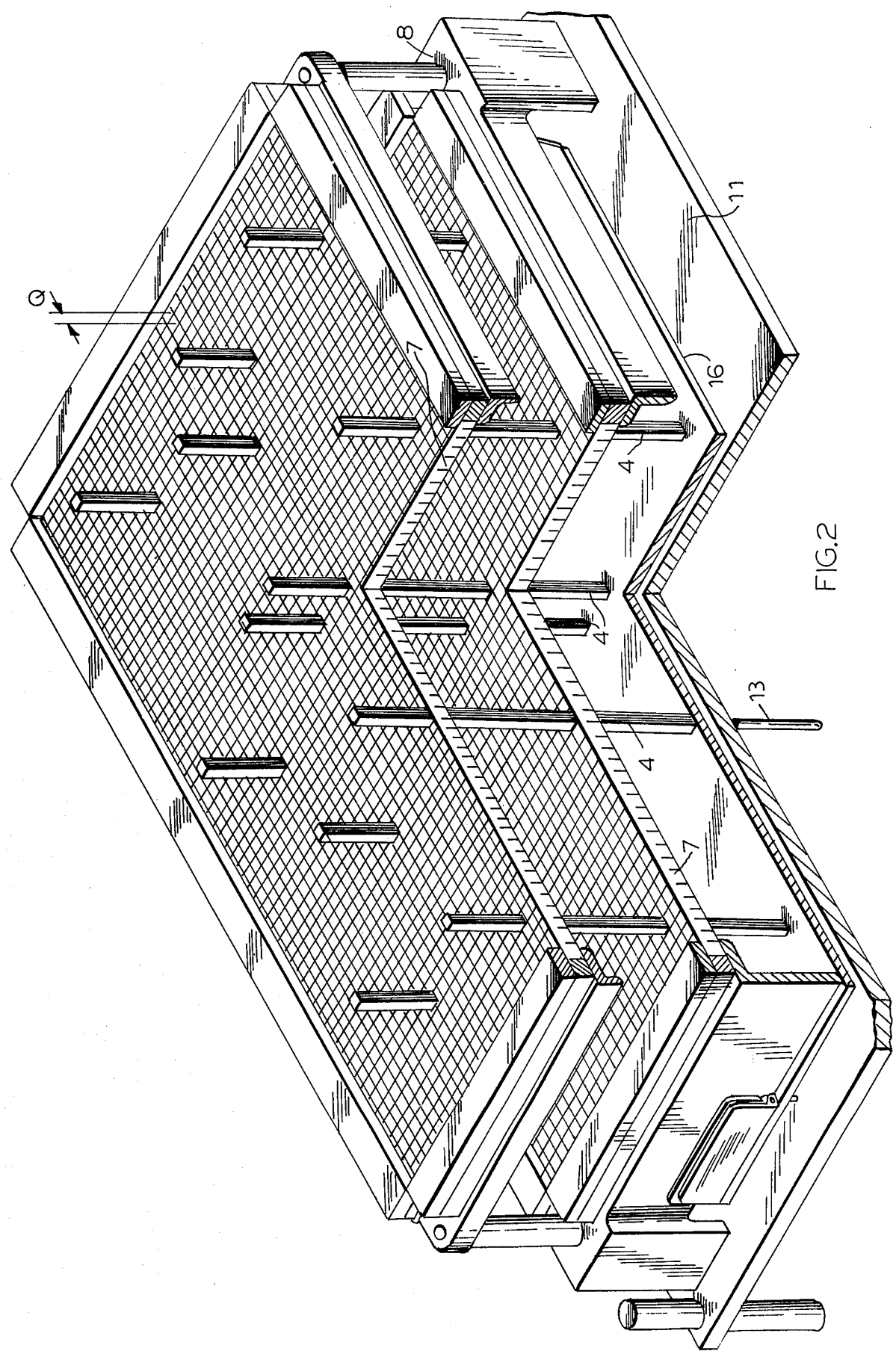
FIG. 2 is a schematic perspective view, partially cut away, of a main portion of the apparatus of FIG. 1.

FIG. 2 is a perspective view, partially cut away the, of main portion of the apparatus of FIG. 1 showing the condition where a plurality of tubular magazines 4 are inserted in predetermined through-holes of the magazine guides 7 of the magazine supporter 8.

Referring to FIGS. 1, 2 and 6 the magazine supporter 8 is mounted on a base support 11 which is slidably mounted on guide shafts 15a and 15b, and which is thus movable vertically by a driving mechanism (not shown) composed e.g. of a mechanical power source such as a motor, cams and levers. By the driving mechanism, the circuit element supply means including the tubular magazines 4, and the magazine supporting means including the lattice-shaped magazine guides 7 and the magazine supporter 8 can move vertically so that the top opening of the magazine 4 can approach and move away from the bottom surface of the base plate 1 which is positioned at a predetermined level. The circuit element supply means and the base plate 11 (or the base plate 11 plus the driving mechanism) constitute a moving means.

Below the movable base plate 11, a plurality of thrust pins 13 are provided and are vertically movably inserted in through-holes 14a in a pair of push-up plates 14. Each thrust pin 13 is also inserted into the center of a coiled compression spring 12 which is supported between the lower push-up plate 14 and a stop plate 17a fixedly mounted on the thrust pin 13 between the two push-up plates 14, as shown. The center axis of each pin 13 is positioned to coincide with the center of a corresponding rectangular through-hole in the magazine guide 7. When each thrust pin 13 moves upward, the upper portion 13a of the thrust pin 13 passes through a through-hole 11a provided in the movable base plate 11 and also through a through-hole 16a provided in a support plate 16 for supporting the bottom end of the magazine 4 as shown. Thereafter, the top end 13a of the thrust pin 13 can freely pass through the bottom opening 6 of the magazine 4 so as to engage the circuit element supporter 19.

The first stop 17a is fixedly provided on the thrust pin 13 between the two push-up plates 14. A second stop 17b is fixedly provided on the thrust pin 13 below the lower push-up plate 14 as shown. The compression spring 12 is provided between the first stop plate 17a and the lower push-up plate 14 for forcing the thrust pin 13 upward in relation to the push-up plates 14. The upward movement of the thrust pin 13 is limited by the second protruding portion 17b which contacts the bottom surface of the lower push-up plate 14 as shown. Therefore, in the absence of a force to move the thrust pin 13 downward, each thrust pin 13 is held at a position where the second stop 17b contacts the lower push-up plate 14. The pair of push-up plates 14 are vertically slidably mounted on the pair of guide shafts 15a and 15b, and can be moved vertically by the above-described driving mechanism (not shown). Each combination of compression spring 12, thrust pin 13 and the push-up plate 14 constitute a circuit element transfer means for transferring each circuit element 9 upward. Reference numeral 18 designates a fixed bed to which the guide shafts 15a and 15b are fixed.

The process for mounting a chip type circuit element 9 at a predetermined position on the base plate 1 for a printed circuit board using the apparatus of FIGS. 1 and 2 will now be described. The base plate 1 having the laminar conductors 1a and the adhesive layers 10 at positions on the major surface thereof where corresponding chip type circuit elements are to be positioned, is transferred by the pair of belts 3a and 3b to the position where the top opening 5 of the magazines 4 face the corresponding adhesive layer 10. The position of the base plate 1 is further precisely controlled by inserting the pins 2a and 2b into position-fixing through-holes of the base plate 1 as shown.

Next, the movable base plate 11 is moved upward to a level where the top opening 5 of each magazine 4 is positioned close to the adhesive layer 10 on the base plate 1. Then, the push-up plates 14 are moved upward so as to move each thrust pin 13 upward where it enters the inside of the magazine 4 through the bottom opening of the magazine 4 and contacts the circuit element support 19. The stack of the circuit elements 9 in the magazine 4 is then pushed upward so that the top circuit element (designated by a reference numeral 9') is pushed against the corresponding adhesive layer 10.

The push-up plates 14 may be moved further upward, but due to the compression of the compression spring 12, the thrust pin 13 does not to forcefully press the top circuit element 9' against the base plate 1 or the adhesive layer 10. The base plate 1 thus has a plurality circuit elements 9' adhered thereto at one time at predetermined. positions thereon.

After push-up plates 14 have been moved upward up to the predetermined level, they are moved downward to move pins 13 downward. Even after the thrust pin 13 moves out of contact with the circuit element supporter 19 due to the downward movement of the thrust pin 13, the supporter 19 does not move downward due to the frictional force between the sides of the supporter 19 and the inner wall of the magazine 4.

Then the movable base plate 11 is moved downward so that the top opening 5 of each magazine 4 moves away from the base plate 1 of the printed circuit board and returns to the original level.

After the pins 2a and 2b are taken out of the base plate 1, the base plate 1 is transferred by the belts 3a and 3b the succeeding stages, where each adhesive layer 10 is heated (preferably after being turned over) to harden it, and solder is applied onto the laminar conductors 1a and the electrodes 102 of the circuit elements 9. Meanwhile, a succeeding base plate 1 is transferred to the position shown in FIG. 1, where the circuit element mounting step is performed again. By repeating the above recited cycle, a plurality of printed circuit boards having chip type circuit elements 9 positioned at predetermined positions and each soldered to a pair of laminar conductors of the printed circuit board, can be produced by mass production.

Figure 3:
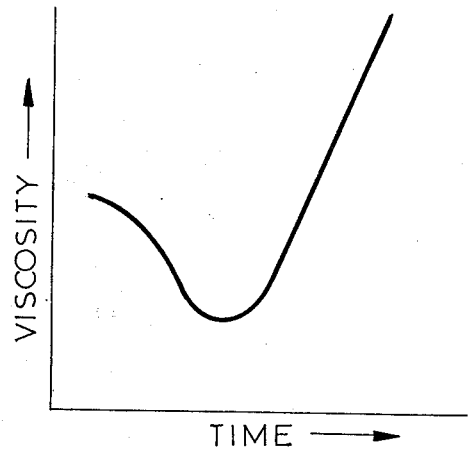
FIG. 3 is a graph showing the relation between the viscosity of an adhesive material and the time of heating the adhesive material.

FIG. 3 shows the change with the change of heating time for the viscosity of an adhesive material employing an epoxy resin and which can be used as the adhesive layer 10. As is apparent from FIG. 3, as the heating time increases, the viscosity of the adhesive material initially decreases, and then increases. Accordingly, the base plate 1 is preferably turned over before the heating step so as to prevent possible separation of each mounted circuit element from the base board due to the viscosity decrease of the adhesive layer upon initial heating of the adhesive layer.

The advantage of the use of the compression spring 12 and the thrust pin 13 as the circuit element transfer means is that is is not necessary to vary the length of the thrust pin 13 and distance of the upward movement of the push-up plates 14 with the variation of the heights of the circuit element stacks in the magazines. Therefore, the structure of the mounting apparatus can be kept simple.

Figure 4:
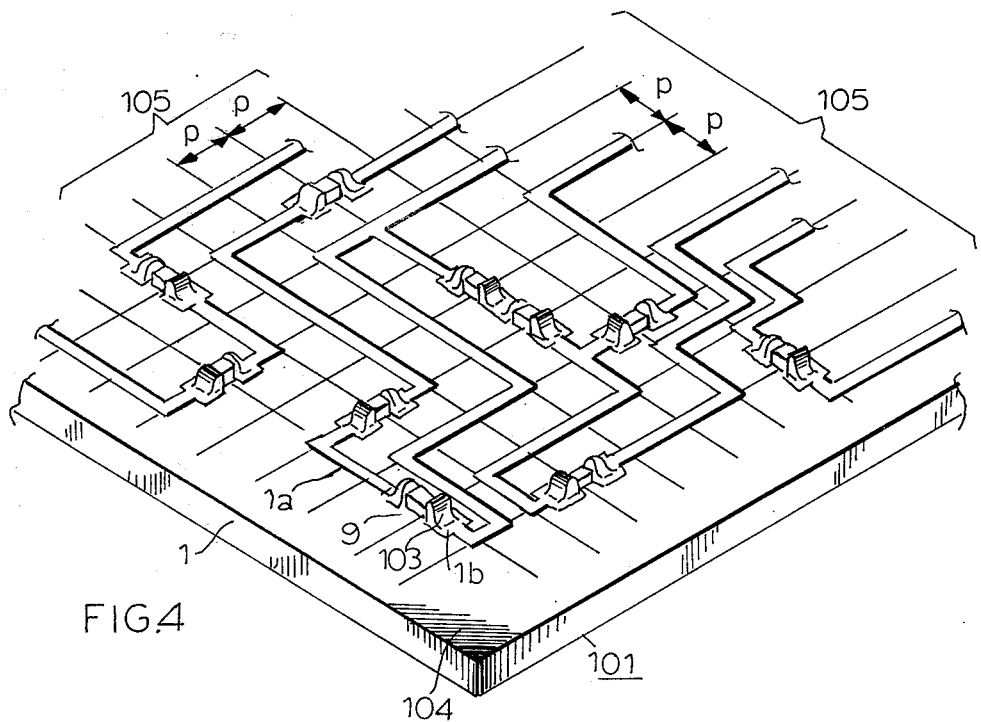
FIG. 4 is a schematic perspective view of a main portion of an example of a printed circuit board with chip type circuit elements, made according to this invention.
Figure 5:
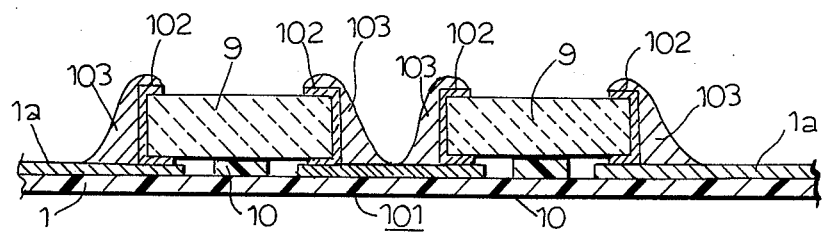
FIG. 5 is an enlarged schematic cross-sectional view of the main portion of the printed circuit board with chip type circuit elements as seen in FIG. 4.

Each of FIGS. 4 and 5 shows the main portion of an example of a printed circuit board with chip type elements made by the method and apparatus of this invention as described above. Referring to FIGS. 4 and 5, the printed circuit board 101 comprises an insulating base plate 1 of a phenol resin laminate, a laminar conductor pattern 1a of copper foil provided on the major surface 104 of the base plate 1, and connector lands 1b for connecting chip type circuit elements 9 thereto.

Each of parallelepiped chip type circuit elements 9 having the pair of electrodes 102 at opposite ends thereof is positioned on a pair of spaced opposed connector lands 1b so as to bridge the pair of connector lands 1b, and is adhered to the base plate 1 by the adhesive layer 10 which is positioned between the lands 1b. The electrodes 102 are soldered to the pair of lands and hence to the laminar conductors 1a by a solder 103. The center of the rectangular face of each parallelepiped circuit element 9 is designed to be positioned at intersection points of a standard square lattice 105 on the major surface 104 of the base plate 1. This is the purpose of the design of the rectangular lattice-shaped magazine guide 7 and the circuit element magazine 4. However, the centers of the rectangular faces of some of the mounted circuit elements may not be exactly positioned at the intersection points of the lattice 105, due e.g. to possible slight differences in clearances between the rectangular through-holes of the magazine guide 7 and the outer walls of the magazines 4 inserted in the through-holes, and/or to possible slight differences of relative positions of the magazines 4 and the circuit elements 9 inserted in the magazines, etc. The lines of the lattice 105 are at a constant pitch P such as 5 mm. That is, the lattice is defined by a first set of equally spaced parallel lines spaced the distance P and a second set of equally spaced parallel lines also spaced the distance P and which are perpendicular to the first set of parallel lines, and both of the first and the second sets of parallel lines are imaginary lines on the major surface 104 of the base plate 1. The rectangular face of each circuit element forcing the major surface 104 of the base plate 1 has a size, for example, of 3.2mm×1.6mm. Thus, the length (L) of the longer side of the rectangular face of the circuit element 9 in this case is 3.2 mm. It is clear that the width P of 5 mm is in the range between $L/3(=1.1$ mm$)$ and $2L(=6.4$mm$)$, and the relation $L/3<P<2L$ is a requirement for the lattice according to this invention. The meaning of this relation will be described in detail later. As is apparent from FIG. 4, each chip type circuit element 9 is fixed to the base plate 1 in a manner such that one side of the circuit element 9 is parallel to one of the lines (e.g. the first set of parallel lines) of the lattice. The base plate 1 preferably has a rectangular or a substantially rectangular shape, and the first and second sets of parallel lines are preferably parallel to the sides of the rectangular base plate 1 to permit easy manufacture.

As described above, in the printed circuit board having chip type circuit elements thereon and made according to this invention, the positions of all the circuit elements are at intersection points of the square lattice because the circuit elements are mounted on the base plate 1 using magazines 4 inserted in through-holes of a square lattice-shaped magazine guide 7. This makes it possible to use the mounting apparatus of FIGS. 1 and 2 which can mass produce the printed circuit board with chip type circuit elements easily and at a high speed without the use of an NC apparatus. A design change in the circuit element position pattern can be easily achieved by merely changing the through-holes of the magazine guide 7 through which the magazines 4 are inserted.

Figure 7:
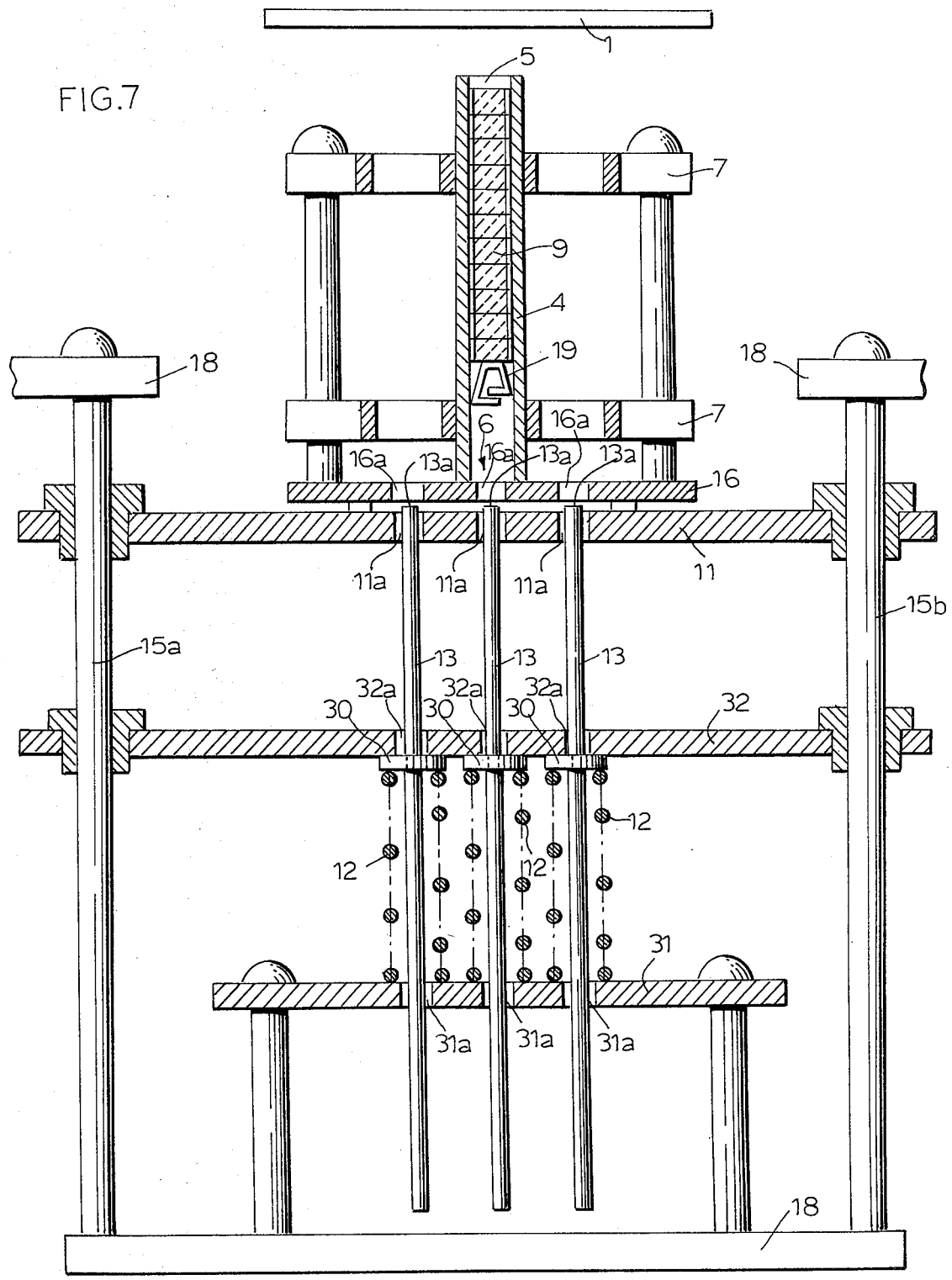
FIG. 7 is a schematic front cross-sectional view of another example of an apparatus according to this invention.

FIG. 7 shows another example of a structure which can be used for vertically moving the thrust pins 13 in place of the structure shown in FIG. 1. Referring to FIG. 7, each thrust pin 13 has a single stop plate 30 fixedly mounted thereon, and a compression spring 12 is supported between the stop plate 30 and a support plate 31 fixedly mounted on the bed 18 and urges the pin 13 upwardly. A movable push-up plate 32 is provided above the stops 30. The support plate 31 and the push-up plate 32 have through-holes 31a and 32a, respectively, through which the thrust pins pass. The embodiment of FIG. 7 is similar to that of FIG. 1 in that the vertical movement of the thrust pins 13 can be performed by vertically moving the push-up plate 32, which allows springs 12 to expand to move the pins. However, the embodiment of FIG. 7 is inferior to that of FIG. 1 in that a relatively strong force is required for moving the push-up plate 32 back down when the number of the pins 13 is large because all the compression springs 12 must be compressed at the same time.

On the other hand, the arrangement of FIG. 1 is superior to that of FIG. 7 in the following two ways. Firstly, in the case of FIG. 1, each compression spring 12 is compressed only when the thrust pin 13 on which the spring 12 is mounted is pressed against a circuit element stack in the magazine 4 at the top end 13a thereof. In the case of an ordinary design of a circuit element pattern on a printed circuit board, the number of magazines inserted in the magazine guide 7 will be less than the number of the thrust pins 13 because the number of the thrust pins 13 should be the same as the number of through holes in the magazine guide 7. Therefore, in the case of FIG. 1, a much smaller force is required for pushing the push-up plate 14 upwardly, so that the push-up or moving mechanism for pushing or moving the push-up plate 14 upwardly can be made simple. This is a first superiority. Secondly, when the circuit element pattern is changed, the springs which are compressed are also changed, so that the springs, as a whole, suffer much less fatigue than that in the case of FIG. 7 where all the springs are compressed during each operation of the apparatus. This is a second superiority.

The push-up plate 14 (or 32) moves a constant distance in the embodiments of both FIG. 1 and FIG. 7. It is required that each thrust pin be out of contact with the circuit element stack at the lowest level of the push-up plate even when the corresponding magazine 4 is completely full of the circuit elements. On the other hand, at the highest level of the push-up plate, the circuit element stack is required to be pressed by the corresponding thrust pin 13 even when the circuit element stack has only one circuit element left therein. Thus, the push-up plate is required to be moved a distance or span or stroke greater than the maximum height of the circuit element stack, i.e. greater than the height of the stack which fills the magazine 4. Further, the degree of compression of the compression springs 12 is greater as the level of the push-up plate 14 becomes higher and as the height of the circuit element stack becomes higher. However, it is required that the pressing force of the thrust pin 13 for pressing the circuit element stack at the highest level of the push-up plate be as constant as possible or be within a narrow range, independently of the number of the circuit elements in each magazine 4. From this stand point, it is preferable to increase the stroke of the push-up plate and to decrease the spring constant of the compression spring 12 as the number of the circuit elements in the magazine 4, i.e. the initial height of the circuit element stack, is increased.

Figure 8:
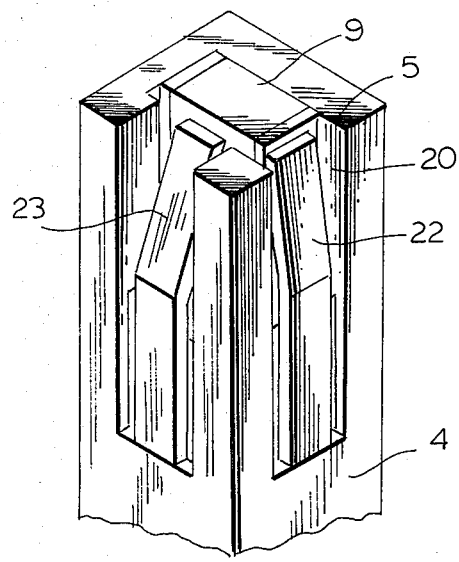
FIG. 8 is the schematic perspective view of a main portion of an example of a magazine for supplying chip type circuit elements which magazine can be used in the apparatus of FIGS. 1 and 7.

The cross-section of the inside of the tubular magazine 4 is preferably larger than the cross-section (or the major rectangular face) of the circuit element 9 so that the circuit element stack can move upward smoothly in the magazine 4. For achieving this end and for positioning the top circuit element in the circuit element stack at a constant position, a magazine having a structure as shown in FIG. 8 can be used. Referring to FIG. 8, the magazine 4 has plate springs 22 and 23 projecting into the center thereof from two adjacent side walls which urge the top circuit element against the other two adjacent sides of the inner wall of the magazine 4, respectively, as shown. Further, the use of such plate springs 22 and 23 makes it possible to position the magazine above the base plate 1 of the printed circuit board and to insert the circuit elements from above, with the base plate 1 being turned upside down, because the plate springs will hold the circuit element stack and prevent the circular element stack from falling out of the magazine even when the magazine 4 is turned upside down.

Figure 9A:
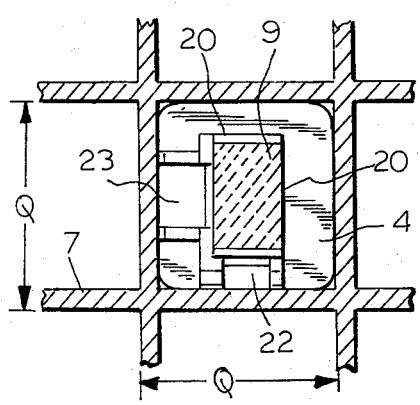
Figure 9B:
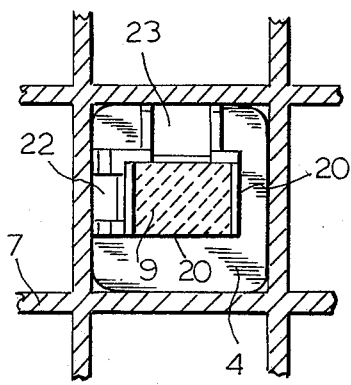
Figure 9C:
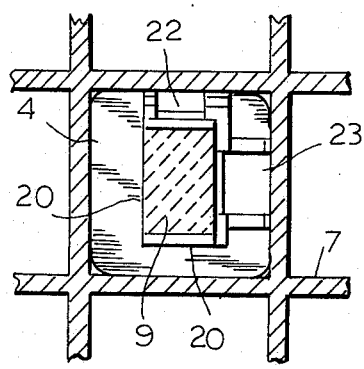
Figure 9D:
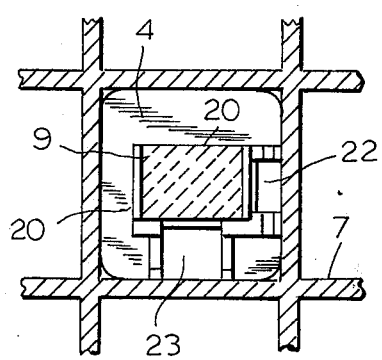

In order to make it possible to use the same magazine 4 even when the direction of the length of the circuit element is required to be turned by 90° around the axis of the tubular magazine 4, a magazine as shown in FIG. 9(A) is preferably used. Referring to FIG. 9(A), the rectangular lattice-shaped magazine guide 7 has a square shape, and thus every through-hole of the magazine guide has a square cross-section as shown. The center of the major rectangular face of the circuit element 9 coincides with the center of the square through-hole of the magazine guide 7, as shown, when the circuit element is urged against the two sides 20 and by the plate springs 22 and 23. Therefore, by using the magazine guide 7 and the magazine 4 as shown in FIG. 9(A), the circuit element can be mounted in any of four different directions as shown in FIG. 9(A), 9(B), 9(C) and 9(D) by merely turning the magazine 4 before it is inserted into the magazine guide 7. The necessity for differently shaped magazines is thus avoided. Further, this arrangement has a further advantage when handling circuit elements having bilateral characteristics such as conventional capacitors and conventional resistors in that the magazine 4 can be inserted into the magazine guide 7 in the position of FIG. 9(A) or FIG. 9(C) and the circuit element will be operable because each bilateral circuit element works in the same manner even when the direction of the circuit element is turned 180°.

The pitch Q of the lattice of the magazine guide 7 is preferably small for making it possible to mount more circuit elements 9 on the circuit board at the same time, and to increase the degree of freedom for designing the circuit element pattern. However, the pitch Q cannot be made shorter than the length L of the longer side of the circuit element. The pitch P of the lattice 105 also is preferably small for making it possible to increase the degree of freedom for designing the circuit element pattern. However, it is highly desirable that the pitch P should satisfy the relation $L/3<P<2L$. This will be explained in detail hereinafter.

In the mounting apparatus as shown in FIGS. 1 and 2, the positions on the major surface of the base plate 1 at which the circuit elements 9 can be attached are limited by the pitch Q of the lattice-shaped magazine guide 7 in which the magazines 4 are to be inserted. This pitch Q should be equal to L plus $\alpha$ ($\alpha>0$), $\alpha$ being equal to the sum of (i) the thickness of the plate forming the magazine guide 7, (ii) the total thickness of the two opposite walls of the magazine 4 against which the longer sides (length L) of the circuit element rests, (iii) the total clearance between the outer surface of one of the above two opposite walls of the magazine 4 and the inner surface of the magazine guide 7 facing that one of the two opposite walls of the magazine 4, and between the outer surface of the other of the two opposite walls of the magazine 4 and the inner surface of the magazine guide 7 facing the other of the two opposite walls of the magazine 4, and (iv) the total clearance between the inner surface of one of the above two opposite walls of the magazine 4 and the end of the circuit element 9 facing that one of the two opposite walls of the magazine 4, and between the inner surface of the other of the two opposite walls of the magazine 4 and the other end of the circuit element 9 facing the other of the two opposite walls of the magazine 4.

If the pitch P is designed to be equal to the pitch Q or to an integral multiple of the pitch Q, all the circuit elements 9 can be attached to the base plate 1 at one time. However, since it is desirable to have the pitch P small for the reasons set forth above, the pitch P is preferably smaller than or equal to the pitch Q (P≦Q). In the case where P is smaller than Q, P is required to be Q/n (n being an integer of 2 or more than 2) because otherwise all the intersection points of the lattice 105 cannot be equidistantly distributed on the major surface of the base plate 1, and hence the circuit element pattern on the base plate 1 becomes difficult to design, and the position of the lattice-shaped magazine guide 7 becomes difficult to set.

If the n value is 2, i.e. P=Q/2, circuit elements 9 can be mounted at all the intersection points of the lattice 105, by using four identical apparatuses mounting each the same as that of FIG. 1. This is more readily understood by reference to FIG. 10(a). Referring to FIG. 10(a), circuit elements can be mounted at the intersection points A of the lattice of pitch P using a first mounting apparatus, the pitch of the magazine guide of which is Q. Circuit elements can be mounted at the intersection points B of the same lattice using a second mounting apparatus, the pitch of the magazine guide of which is Q, and the relative position of the magazine guide to the base plate 1 is shifted by Q/2 in comparison with that in the case of the first mounting apparatus, as can be understood from the chart of FIG. 10(a). Similarly, circuit elements can be mounted at the intersection points C and D of the same lattice using a third and a fourth mounting apparatus, respectively, the pitch of the magazine guide of each of which is Q and the relative positions of the magazine guides of which are shifted by Q/2 in comparison with those in the case of the first and the second mounting apparatus, respectively.

Likewise, if P=Q/3, nine mounting apparatuses are required for mounting circuit elements at the nine kinds (A to I) of intersection points within pitch Q and constituting all the intersection points of the lattice of pitch P, as is apparent from FIG. 10(b).

Thus, in general, if P=Q/n, $n^2$ mounting apparatuses are required. The degree of design freedom increases as the n value increases (and hence the pitch P decreases). But as the n value increases, the number of the required mounting apparatuses and hence the expense of the total mounting system increases exponentially by ($n^2$). Moreover, as the pitch P becomes smaller, it becomes necessary to control more closely the position of the base plate 1 relative to the magazine guide of each of the $n^2$ mounting apparatuses. This position control becomes much more difficult as the n value increases. Accordingly, from a practical point of view, the n value should not be larger than 3 (i.e., n≦3). For this reason, and because $$Q=L+\alpha \ (\alpha>0):$$

$$P=Q/n \geq Q/3 = (L+\alpha)/3 = L/3 + \alpha/3 > L/3$$

That is, P should be larger then L/3.

On the other hand, since the α value in Q=L+α is preferably small for minimizing the pitch Q and can be easily made smaller than L (i.e., α<L), and because P≦Q:

$$P \leq Q = L + \alpha < 2L$$

That is, P should be smaller than 2L. This is why it is highly desirable that the pitch P be such as to satisfy the relation L/3<P<2L.

FIG. 11 shows the main portion of another example of a printed circuit board with chip type circuit elements, made according to this invention. This example is quite similar to that of FIG. 4, except that here all the parallelepiped circuit elements 9 are arranged in the same direction as shown. Due to the unidirectional arrangement of the circuit element pattern, the magazine holder comprising the lattice-shaped magazine guide 7 in the mounting apparatus of FIG. 1 can be replaced by another magazine holder 39 comprising a set of parallel magazine guide plates 37 each having equally spaced protruding guides 38 as shown in FIG. 12. And the magazine 4 of FIG. 1 can be replaced by a tubular magazine 41 which has a pair of grooves 40 in the opposite outside wall surfaces and which can be inserted between adjacent guide plates 37 and guided by the protruding guides 38 along which the grooves 40 can slide as shown in FIG. 12.

The outside length l of the magazine 41 can be made longer than that of the magazine 4 used in the apparatus of FIG. 1 by an amount equal to the thickness of the plates forming the magazine guide 7 of FIG. 1. Therefore, by the apparatus of FIG. 12, circuit elements each having a greater length than the circuit elements handled in the apparatus of FIG. 1 can be handled.

FIG. 13 shows yet another example of a printed circuit board with chip type circuit elements, made according to this invention. This example is quite similar to that of FIG. 4, except for the following two points. Firstly, in FIG. 13, the centers of the chip type circuit elements 9 each having a length (i.e., the length of the longer side of the element) $L_1$ (such as 3.2 mm) are positioned at intersection points of a first standard lattice 42 of pitch $P_1$ (such as 2.5 mm) on a printed circuit board 101. Secondly, the centers of larger chip type circuit elements 43 each having a length (i.e., the length of the longer side of the element 43) $L_2$ (such as 6.0 mm) are positioned at intersection points of a second standard lattice 44 of a pitch $P_2$ which is an integral multiple of the pitch $P_1$ such as three times the pitch $P_1$. The first and second sets of equally spaced parallel lines which are perpendicular to each other and which define the first standard lattice are parallel to the third and the fourth sets of equally spaced parallel lines which define the second standard lattice 44, respectively, as shown. These lengths $L_1$ and $L_2$ and the pitches $P_1$ and $P_2$ satisfy the following relations just as in the case of FIGS. 1 and 2:

$$L_1/3 < P_1 < 2L_1, \ L_2/3 < P_2 < 2L_2$$

The method for mounting the circuit elements 9 and 43 shown in FIG. 13 onto the base plate 1 for the printed circuit board 101 will be described below, with reference to FIG. 1 also.

The pitch Q of each magazine guide 7 is required to the larger than the corresponding length $L_1$ (=3.2 mm) or $L_2$ (=6.0 mm) of the circuit element held in that magazine guide 7. Therefore, the pitch Q cannot be made equal to the pitch $P_1$ (=2.5mm). Thus, the pitch Q of the magazine guide 7 is first selected to be $Q_1=2P_1=5$ mm $>L_1$ (=3.2 mm). Four identical mounting apparatuses the magazine guide 7 of each of which has a constant pitch $Q_1$ (5mm) are prepared. The positions of the intersection points of the lattice 42 can be classified into four groups as shown in FIG. 10(a). The circuit elements 9 (having a length $L_1=3.2$ mm) of the first group are mounted on the base board 1 by using the first one of the four mounting apparatuses. Similarly, the circuit elements 9 of the second, the third and the fourth groups are mounted on the base board 1 by using the second, the third and the fourth of the four mounting apparatuses, respectively, in the manner described above with reference to FIG. 10(a).

Then, a further mounting apparatus the magazine guide 7 of which has a pitch $Q_2=P_2=7.5$ mm $<L_2=6.0$ mm is prepared, and using this mounting apparatus, all the larger size circuit elements 45 (each having a length $L_2=6.0$ mm) are mounted on the base plate 1. The base plate 1 having thus had the elements 9 and 43 mounted thereon is then subjected to the heating step for hardening the adhesive layers 10 and the soldering step just as in the case of the example of FIG. 4.

As is evident from the above description, by using a plurality of standard lattices 42 and 44 corresponding to the plurality of lengths $L_1$ and $L_2$ of the circuit elements, the number of mounting apparatuses can be minimized, even if an lattice having a short pitch (e.g. $P_1$) is used for smaller size circuit elements, without being limited by the length (e.g. $L_2$) of the larger size circuit elements.

Next, a preferred method for compensating for possible curvature of the surface of the base plate 1 will be described with reference to FIG. 14. In general, a base plate made e.g. of a phenol resin laminate is likely to lose its flatness, and to become curved. When such a plate is used for the base plate, it is difficult to keep the space between the top end of each magazine 4 and the major (bottom) surface of the base plate 1 constant and uniform as in the apparatus of FIG. 1. A rigid flat correction plate 27, correction pins 29 and dummy magazines 28, as shown in FIG. 14, can be used for compensating for such a curved plate 1. That is, in FIG. 14, dummy magazines 28 each having the same height and having no circuit elements therein are inserted in the magazine guide 7 and supported by the supporter plate 16. Just above respective dummy magazines 28, are correction pins 29 each having the same height and supported by the rigid flat correction plate 27. By being firmly sandwiched by and between the correction pins 29 and the dummy magazine 28 as shown in FIG. 14, the base plate 1 can be kept flat.

By the arrangement of FIG. 14, the space between the base plate 1 and the top end of each magazine 4 can be forcedly kept constant (the size of the space being equal to the difference between the height of the magazine 4 and that of the dummy magazine 28). Therefore, it becomes easy to prevent the top end or opening 5 of each magazine 4 from being stained by the adhesive layers and/or solder resist coated on the base plate 1. If it becomes necessary to insert a magazine 4 in the position of the dummy magazine 28, it is only necessary to take out the dummy magazine and instead insert the magazine 4 therein. Thus, the mounting positions of circuit elements are not limited by the presence of the dummy magazines.

Further, by making the correction pin 29 sufficiently long, protruding elements such as solid resistors can be preliminarily attached to the opposite surface of the base plate 1, i.e. between the base plate 1 and the correction plate 27.

In the embodiments of the mounting apparatus described above, the level of the base plate 1 is kept constant, and instead the magazines 4 are moved vertically for mounting the circuit elements. However, if necessary, the base plate can be moved vertically instead of or in addition to the vertical movement of the magazines 4.

As is apparent from the foregoing description, a printed circuit board with chip type circuit elements can be made by a mounting method using a relatively simple mounting apparatus according to this invention such as that of FIG. 1. For example, several dozens of circuit elements can be easily mounted on the base plate at one time. Therefore, the efficiency of the circuit element mounting can be very high, so that printed circuit board with chip type circuit elements can be made very inexpensively. Further, the use of a conventional NC apparatus is not necessary, and a simple mounting apparatus can be used, which works in a simple manner and which is inexpensive and reliable in operation can be used.

Moreover, the resultant circuit element pattern on the base plate 1 can be easily changed by merely changing the positions of the magazines 4 i.e. merely selecting the appropriate through-holes of the magazine guide 7 through which the magazines 4 are to be inserted. Therefore, the mounting apparatus can easily accommodate a design change of the circuit element pattern. Further, when the circuit elements in a magazine are required to be changed to a different type or when all the circuit elements in the magazine have been mounted on base plates, it is only necessary to take the magazine out of the through-hole of the magazine guide and to insert a new magazine into the same through-hole of the magazine guide. Therefore, the circuit element mounting can be continued without a long break, so that such mounting apparatus is also suitable for small volume production of many different circuit element patterns. Thus, the method and apparatus according to this invention by which the circuit elements are positioned at lattice-based positions on the printed circuit board is much superior to a conventional method and apparatus by which the circuit elements are not positioned at intersection points of a lattice, but are positioned using an NC apparatus.

What is claimed is:

1. A method for mounting chip type circuit elements on a printed circuit board, comprising: horizontally positioning a printed circuit board having a plurality of adhesive layers at predetermined positions on the bottom major surface thereof; arranging a plurality of hollow tubular magazines in vertical through-holes in a lattice-shaped magazine guide in positions corresponding to the positions of said adhesive layers, simultaneously pushing all of the magazines upwardly to positions where the top opening of each tubular magazine is in spaced opposed relation to the corresponding adhesive layer, stacking a plurality of chip type circuit elements in each tubular magazine; simultaneously pushing each circuit element stack upwardly in the tubular magazines for pressing the top circuit element in each circuit element stack onto the corresponding adhesive layer so as to bond said top circuit element to the corresponding adhesive layer; and urging one of the circuit elements in each of said tubular magazines against an inside vertical wall of the magazine by a plate spring inside the magazine.

2. A method as claimed in claim 1, wherein said printed circuit board is turned downside up and then each of said adhesive layers is then heated, hardening it.

3. A method as claimed in claim 1, wherein each through-hole of said magazine guide and each tubular magazine each has a rectangular cross-section.

4. A method as claimed in claim 1, wherein each through-hole of said magazine guide and each tubular magazine each has a square cross-section.

5. A method as claimed in claim 4, wherein the center of said through-hole of said magazine guide and the center of said tubular magazine lie on the same vertical line, whereby the center of the circuit elements are positioned on said vertical line.

6. A method as claimed in claim 5, wherein the centers of said plurality of through-holes in said magazine guide and the centers of said tubular magazines are at positions corresponding to the intersections of lines forming a square lattice with the lines being at a pitch Q, said lattice being one of a plurality adjacent equidistantly spaced square lattices with the lines at a pitch Q and the distance between adjacent lattices being Q/$n$ where $n$ is an integer.

7. A method as claimed in claim 1, wherein said plate spring is positioned near the top of the tubular magazine for urging the top circuit element in the circuit element stack against the side wall of said tubular magazine.

8. A method as claimed in claim 1, wherein said step of pushing each circuit element upwardly comprises moving a thrust pin vertically through the bottom opening of said tubular magazine and upwardly biasing said thrust pin by a compression spring.

9. A method as claimed in claim 1, further comprising positioning a plurality of dummy magazines among said tubular magazines at positions which are out of correspondence with said adhesive layers and with the top end of each dummy magazine at a level higher than that of the top end of each tubular magazine; raising the dummy magazines with the tubular magazines for supporting the printed circuit board between the top ends of the dummy magazines and flatness correction pins projecting downwardly from a rigid flatness correction plate at positions corresponding to the positions of the dummy magazines for keeping the printed circuit board flat.

10. A method for mounting chip type circuit elements on a printed circuit board, comprising: horizontally positioning a printed circuit board having a plurality of adhesive layers at predetermined positions on the bottom major surface thereof; arranging a plurality of hollow tubular magazines in vertical through-holes in a lattice-shaped magazine guide in positions corresponding to the positions of said adhesive layers, simultaneously pushing all of the magazines upwardly to positions where the top opening of each tubular magazine is in spaced opposed relation to the corresponding adhesive layer, stacking a plurality of chip type circuit elements in each tubular magazine; simultaneously pushing each circuit element stack upwardly in the tubular magazines for pressing the top circuit element in each circuit element stack onto the corresponding adhesive layer so as to bond said top circuit element to the corresponding adhesive layer; positioning a plurality of dummy magazines among said tubular magazines at positions which are out of correspondence with said adhesive layers and with the top end of each dummy magazine at a level higher than that of the top end of each tubular magazine; raising the dummy magazines with the tubular magazines for supporting the printed circuit board between the top ends of the dummy magazines and flatness correction pins projecting downwardly from a rigid flatness correction plate at positions corresponding to the positions of the dummy magazines for keeping the printed circuit board flat.

11. A method as claimed in claim 10, wherein said printed circuit board is turned downside up and then each of said adhesive layers is then heated, hardening it.

12. A method as claimed in claim 10, wherein each through hole of said magazine and each tubular magazine each has a rectangular cross-section.

13. A method as claimed in claim 10, wherein each through-hole of said magazine guide and each tubular magazine each has a square cross-section.

14. A method as claimed in claim 13, wherein the center of said through-hole of said magazine guide and the center of said tubular magazine lie on the same vertical line, whereby the center of the circuit elements are positioned on said vertical line.

15. A method as claimed in claim 14, wherein the centers of said plurality of through-holes in said magazine guide and the centers of said tubular magazines are at positions corresponding to the intersections of lines forming a square lattice with the lines being at a pitch Q, said lattice being one of a plurality adjacent equidistantly spaced square lattices with the lines at a pitch Q and the distance between adjacent lattices being Q/$n$, where $n$ is an integer.

16. A method as claimed in claim 10, wherein each of said tubular magazines has a plate spring therein urging at least one of the circuit elements therein against an inside wall of said tubular magazine.

17. A method as claimed in claim 16, wherein said plate spring is positioned near the top of the tubular magazine for urging the top circuit element in the circuit element stack against the side wall of said tubular magazine.

18. A method as claimed in claim 10, wherein said step of pushing each circuit element upwardly comprises moving a thrust pin vertically through the bottom opening of said tubular magazine and upwardly biasing said thrust pin by a compression spring.

19. An apparatus for mounting chip type circuit elements on a printed circuit board, the apparatus comprising: a supporter for horizontally supporting, at a predetermined level and at a predetermined position, a printed circuit board having a predetermined number of adhesive layers at predetermined positions on the bottom major surface thereof; horizontally positioned lattice-shaped magazine guide spaced below said supporter and which has a plurality of equidistantly spaced through-holes therein, a portion of the plurality of through-holes being in positions corresponding to the positions of the adhesive layers; a plurality of hollow vertical tubular magazines slidably fitted in the through-holes in said magazine guide, and having a top opening opposed to the position on the circuit board where the corresponding adhesive is positioned, each of said tubular magazines having a hollow interior shaped to hold a stack of a plurality of chip type circuit elements; a circuit element transfer means movable upwardly into the respective magazines for pushing the circuit element stack therein upwardly for pressing the top circuit element in each circuit element stack onto the corresponding adhesive layer on the circuit board to bond the top circuit element to the corresponding adhesive layer; a push-up plate on which said tubular magazines are supported and which is vertically movable for pushing the tubular magazines upwardly through the through-holes to move the top opening of each tubular magazine to a position close to and opposed to the corresponding adhesive layers on the circuit board; and a plate spring on the inside of each of said tubular magazines for urging one of the circuit elements against an inside vertical wall of said tubular magazine.

20. An apparatus as claimed in claim 19, wherein each through-hole of said magazine guide and each tubular magazine each has a rectangular cross-section.

21. An apparatus as claimed in claim 19, wherein each through-hole of said magazine guide and each tubular magazine has a square cross-section.

22. An apparatus as claimed in claim 21, wherein the center of said through-hole of said magazine guide and the center of said tubular magazine lie on the same vertical line, whereby the center of the circuit elements are positioned on said vertical line.

23. An apparatus as claimed in claim 22, wherein the centers of said plurality of through-holes in said magazine guide and the centers of said tubular magazines are at positions corresponding to the intersections of lines forming a square lattice with the lines being at a pitch Q, said lattice being one of a plurality adjacent equidistantly spaced square lattices with the lines at a pitch Q and the distance between adjacent lattices being $Q/n$, where $n$ is an integer.

24. An apparatus as claimed in claim 19, wherein said plate spring is positioned near the top of the tubular magazine for urging the top circuit element in the circuit element stack against the side wall of said tubular magazine.

25. An apparatus as claimed in claim 19, wherein said circuit element transfer means comprises a thrust pin movable vertically move through the bottom of each tubular magazine and a compression spring upwardly biasing said thrust pin.

26. An apparatus as claimed in claim 19, further comprising a plurality of dummy magazines on said push-up plate and extending through others of the plurality of through-holes in said magazine guide which are in positions other than positions corresponding to the adhesive layers on the circuit board, the top end of each dummy magazine being at a level higher than that of the top end of the tubular magazines for supporting the printed circuit board on the top end surface thereof when the magazines are pushed up by said push-up plate; a rigid flat correction plate above said supporter and having a plurality of flatness correction pins corresponding to the number of said dummy magazines and projecting downwardly therefrom for sandwiching the printed circuit board between the dummy magazines and the corresponding flatness correction pins for keeping the printed circuit board flat.

27. An apparatus for mounting chip type circuit elements on a printed circuit board, the apparatus comprising: a supporter for horizontally supporting, at a predetermined level and at a predetermined position, a printed circuit board having a predetermined number of adhesive layers at predetermined positions on the bottom major surface thereof; a horizontally positioned lattice-shaped magazine guide spaced below said supporter and which has a plurality of equidistantly spaced through-holes therein, a portion of the plurality of through-holes being in positions corresponding to the positions of the adhesive layers; a plurality of hollow vertical tubular magazines slidably fitted in the through-holes in said magazine guide, and having a top opening opposed to the position on the circuit board where the corresponding adhesive is positioned, each of said tubular magazines having a hollow interior shaped to hold a stack of a plurality of chip type circuit elements; a circuit element transfer means movable upwardly into the respective magazines for pushing the circuit element stack therein upwardly for pressing the top circuit element in each circuit element stack onto the corresponding adhesive layer on the circuit board to bond the top circuit element to the corresponding adhesive layer; a push-up plate on which said tubular magazines are supported and which is vertically movable for pushing the tubular magazines upwardly through the through-holes to move the top opening of each tubular magazine to a position close to and opposed to the corresponding adhesive layers on the circuit board; a plurality of dummy magazines on said push-up plate and extending through others of the plurality of through-holes in said magazine guide which are in positions other than positions corresponding to the adhesive layers in the circuit board, the top end of each dummy magazine being at a level higher than that of the top end of the tubular magazines for supporting the printed circuit board on the top end surface thereof when the magazines are pushed up by said push-up plate; a rigid flat correction plate above said supporter and having a plurality of flatness correction pins corresponding to the number of said dummy magazines and projecting downwardly therefrom for sandwiching the printed circuit board between the dummy magazines and the corresponding flatness correction pins for keeping the printed circuit board flat.

28. An apparatus as claimed in claim 27, wherein each through-hole of said magazine guide and each tubular magazine each has a rectangular cross-section.

29. An apparatus as claimed in claim 27, wherein each through-hole of said magazine guide and each tubular magazine each has a square cross-section.

30. An apparatus as claimed in claim 29, wherein the center of each through-hole of said magazine guide and the center of the corresponding tubular magazine lie on the same vertical line, whereby the center of the circuit elements are positioned on said vertical line.

31. An apparatus as claimed in claim 30, wherein the centers of said plurality of through-holes in said magazine guide and the centers of said tubular magazines are at positions corresponding to the intersections of lines forming a square lattice with the lines being at a pitch Q, said lattice being one of a plurality adjacent equidistantly spaced square lattices with the lines at a pitch Q and the distance between adjacent lattices being $Q/n$, where $n$ is an integer.

32. An apparatus as claimed in claim 27, wherein each of said tubular magazines has a plate spring therein urging at least one of the circuit elements therein against an inside wall of said tubular magazine.

33. An apparatus as claimed in claim 32, wherein said plate spring is positioned near the top of the tubular magazine for urging the top circuit element in the circuit element stack against the side wall of said tubular magazine.

34. An apparatus as claimed in claim 27, wherein said circuit element transfer means comprises a thrust pin movable vertically through the bottom of each tubular magazine and a compression spring upwardly biasing said thrust pin.

* * * * *